(12) United States Patent
Shin et al.

(10) Patent No.: US 12,040,805 B2
(45) Date of Patent: Jul. 16, 2024

(54) RING OSCILLATOR, RANDOM NUMBER GENERATOR INCLUDING THE SAME, AND OPERATION METHOD OF RANDOM NUMBER GENERATOR

(71) Applicant: SAMSUNG ELECTRONICS CO., LTD., Suwon-si (KR)

(72) Inventors: Hoyoung Shin, Gunpo-si (KR); Bora Kim, Hwaseong-si (KR); Junho Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 31 days.

(21) Appl. No.: 17/853,148

(22) Filed: Jun. 29, 2022

(65) Prior Publication Data

US 2023/0019282 A1    Jan. 19, 2023

(30) Foreign Application Priority Data

Jul. 13, 2021    (KR) .......................... 10-2021-0091690

(51) Int. Cl.
*G06F 7/58*    (2006.01)
*H03K 19/173*    (2006.01)
(Continued)

(52) U.S. Cl.
CPC ............ *H03L 7/0996* (2013.01); *G06F 7/582* (2013.01); *H03K 19/1737* (2013.01);
(Continued)

(58) Field of Classification Search
CPC ............ G06F 7/58; G06F 7/582; G06F 7/588; H03K 3/0315; H03K 3/84; H03K 5/22; H03L 7/1077
(Continued)

(56) References Cited

U.S. PATENT DOCUMENTS 7,424,500 B2    9/2008 Fukushima et al.
8,260,835 B2 *  9/2012 Fukushima ............. G06F 7/588
                                              708/251

(Continued)

FOREIGN PATENT DOCUMENTS

KR    10-0668554    1/2007

OTHER PUBLICATIONS

Kaiyuan Yang et al., "An All-Digital Edge Racing True Random Number Generator Robust Against PVT Variations", IEEE Journal of Solid-State Circuits (vol. 51, Issue: 4, Apr. 2016).

*Primary Examiner* — Hai L Nguyen
(74) *Attorney, Agent, or Firm* — F. Chau & Associates, LLC

(57) ABSTRACT

A random number generator includes a ring oscillator, an inversion selecting circuit, and controller. The ring oscillator includes an inverter chain having at least one inverter and generates an output signal. The inversion selecting circuit controlling a phase inverter configured to invert a signal of the inverter chain. The controller is configured to operate the inversion selecting circuit to provide an output of the first phase inverter to the inverter chain during a first operation mode to measure a frequency of the ring oscillator and operate the inversion selecting circuit to not provide the output of the phase inverter during a second operation mode for generating a random number.

14 Claims, 14 Drawing Sheets

(51) Int. Cl.
   *H03L 7/081* (2006.01)
   *H03L 7/083* (2006.01)
   *H03L 7/099* (2006.01)
   *H03L 7/107* (2006.01)

(52) U.S. Cl.
   CPC ............ *H03L 7/0818* (2013.01); *H03L 7/083* (2013.01); *H03L 7/1077* (2013.01)

(58) Field of Classification Search
   USPC .................................. 375/376; 708/250–256
   See application file for complete search history.

(56) References Cited

U.S. PATENT DOCUMENTS

| | | |
|---|---|---|
| 9,335,972 B2 | 5/2016 | Yang et al. |
| 9,377,997 B2 | 6/2016 | Vasyltsov et al. |
| 9,606,771 B2 * | 3/2017 | Mei .......................... H03K 3/84 |
| 10,331,410 B2 | 6/2019 | Wesson et al. |
| 10,445,068 B2 | 10/2019 | Haddad et al. |
| 2015/0106415 A1 | 4/2015 | Mei et al. |

* cited by examiner

RING OSCILLATOR, RANDOM NUMBER GENERATOR INCLUDING THE SAME, AND OPERATION METHOD OF RANDOM NUMBER GENERATOR

CROSS-REFERENCE TO RELATED APPLICATION

This U.S. patent application claims priority under 35 U.S.C. § 119 to Korean Patent Application No. 10-2021-0091690, filed on Jul. 13, 2021, in the Korean Intellectual Property Office, the disclosure of which is incorporated by reference in its entirety herein.

1. Technical Field

The inventive concept relates to a ring oscillator for generating a random number, a random number generator including the ring oscillator, and an operation method of the random number generator.

2. Discussion of Related Art

A random number generator (RNG) is widely used in various fields such as the Internet of Things (IoT), artificial intelligence, databases, and information protection. A random number generator should be stable and capable of generating random numbers quickly. Data may be encrypted using a random number generator. However, security of the data may be comprised when a defect occurs in the random number generator. A true random number generator (TRNG) is a device that generates a random number by using a physical phenomenon. Examples of true random number generation technology include a phase-locked loop (PLL) method, a self-timed ring method, a metastability method, and a ring oscillator method.

The ring oscillator method may include a transition effect ring oscillator (TERO)-type TRNG that generates random numbers using a transition effect. However, because characteristics of a random bit generation rate (bit rate) change greatly depending on the frequency and process/voltage/temperature (PVT) of an oscillator core of the ring oscillator as the temperature or power thereof changes during random bit generation, the dispersion of the random bit generation rate increases.

SUMMARY

At least one embodiment of the inventive concept provides a random number generator for monitoring and calibrating a ring oscillator to optimize the random performance and random number generation rate of the random number generator and an operation method of the random number generator.

At least one embodiment of the inventive concept provides a method of monitoring a frequency of a ring oscillator by using less resources.

According to an embodiment of the inventive concept, there is provided a random number generator that includes a ring oscillator, an inversion selecting circuit, and a controller. The ring oscillator includes an inverter chain having at least one inverter and generating an output signal. The inversion selecting circuit is for controlling a phase inverter to invert a signal of the inverter chain. The controller is configured to operate the inversion selecting circuit to provide an output of the first phase inverter to the inverter chain during a first operation mode to measure a frequency of the ring oscillator and operate the inversion selecting circuit to not provide the output of the first phase inverter during a second operation mode for generating a random number.

According to an embodiment of the inventive concept, there is provided a random number generating method performed by a random number generator. The random number generating method includes determining whether a current mode is set to a first operation mode or a second operation mode, inverting a phase of a first signal of a ring oscillator to measure and calibrate a frequency of the ring oscillator when it is determined that the current mode is set to the first operation mode, and generating a random number using the ring oscillator without inverting the phase when it is determined that the current mode is set to the second operation mode. The ring oscillator includes at least one inverter and generates an output signal as a basis for the random.

According to an embodiment of the inventive concept, there is provided a ring oscillator including an inverter chain, an inversion selecting circuit, and a controller. The inverter chain includes a plurality of inverters. The inversion selecting circuit is for controlling a phase inverter for inverting a signal of the inverter chain. The controller module operates the inversion selecting circuit to provide an output of the first phase inverter to the inverter chain during a first operation mode to measure a frequency of the ring oscillator and operates the inversion select circuit to not provide the output of the phase inverter during a second operation mode to generate a random number.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
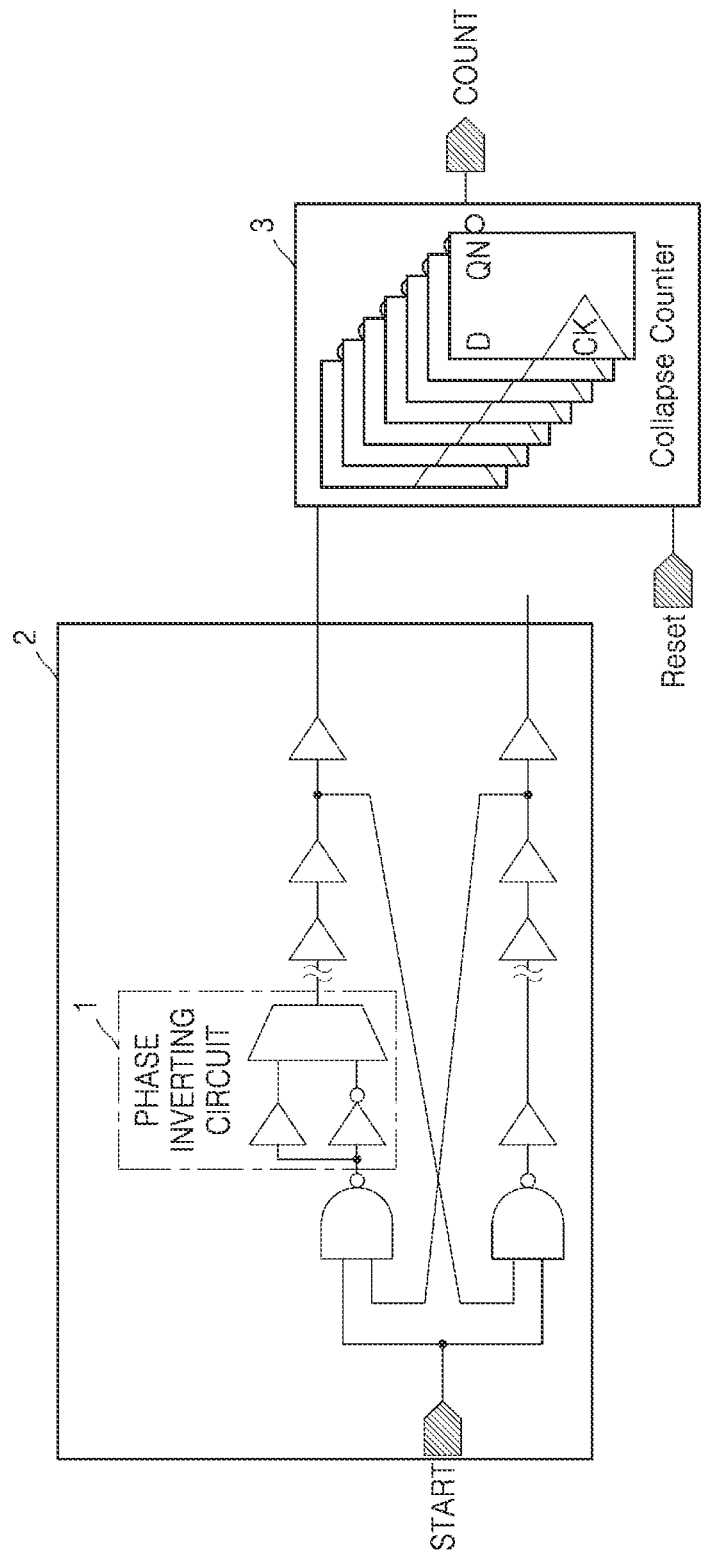
FIG. 1 is a block diagram schematically illustrating a random number generating system according to an embodiment of the inventive concept.

FIG. 1 is a block diagram schematically illustrating a random number generator according to an embodiment of the inventive concept.

The random number generator may include a ring oscillator 2 and a collapse counter 3 (e.g., a counter circuit). The ring oscillator 2 may include a phase inverting circuit 1.

The ring oscillator 2 may include a plurality of inverters or buffers. The ring oscillator 2 may include a plurality of inverters connected in a chain form and may generate a pulse that has a delay equal to the number of connected inverters, is output with an input inverted through the plurality of inverters, and has a certain period. The ring oscillator 2 may include the phase inverting circuit 1. The phase inverting circuit 1 may include a multiplexer and an inverter. The ring oscillator 2 may determine whether to use a phase inverter when generating a pulse through the multiplexer included in the phase inverting circuit 1. For example, the phase inverting circuit 1 may selectively provide an output of its internal inverter (i.e., the phase inverter) to the plurality of inverters or the buffers. In an embodiment, the ring oscillator 2 generates the pulse by using a plurality of inverters connected in a chain during a first mode and generates the pulse by using a configuration in which an inverter is added to the chain during a second mode. In an embodiment, the phase inverting circuit 1 may include at least one inverter.

The collapse counter 3 may count a number of pulses generated by the ring oscillator 2. For example, the collapse counter 3 may count the number of pulses that occur during a certain period. The collapse counter 3 may include a plurality of flip-flops, and the number of flip-flops in the collapse counter 3 may vary according to the range of the number of pulses to be counted by the collapse counter 3. A collapse count may be the number of pulses generated by the ring oscillator 2. The collapse counter 3 may reset the collapse count to 0 or some other predefined value upon receiving a reset signal.

Figure 2A:
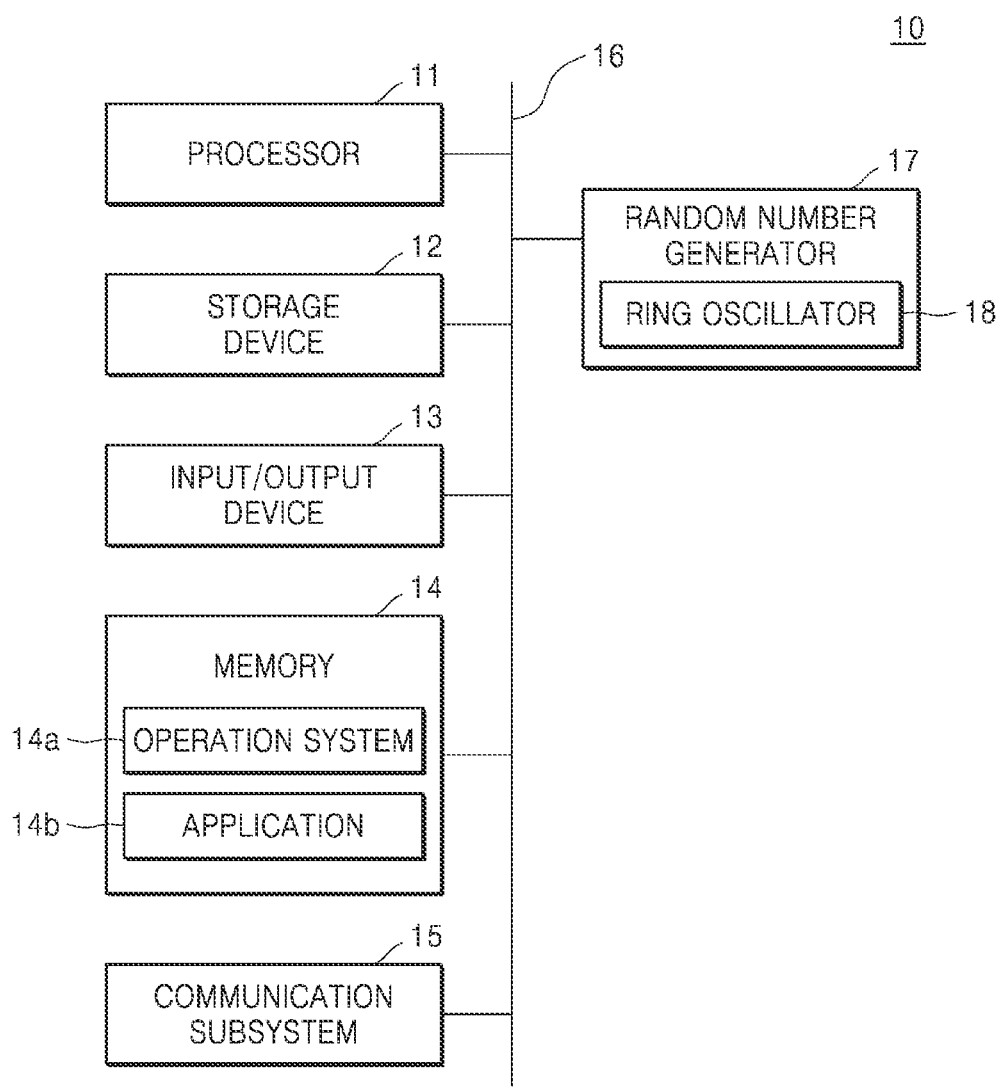
FIG. 2A is a block diagram schematically illustrating an apparatus according to an embodiment of the inventive concept.

FIG. 2A is a block diagram schematically illustrating an apparatus 10 according to an embodiment of the inventive concept.

Referring to FIG. 2A, the apparatus 10 may include a processor 11, a storage device 12, an input/output device 13, a memory 14, a communication subsystem 15, a bus 16, and a random number generator 17. The apparatus 10 may include hardware elements that may be electrically coupled (or may communicate with each other) through the bus 16. That is, the processor 11 may include hardware elements, and the hardware elements may include one or more general-purpose processors and/or one or more special-purpose processors (e.g., digital signal processing chips or graphics acceleration processors). The input/output device 13 may input/output data to be processed or to be processed by the processor 11.

The storage device 12 may include, without limitation, local and/or network accessible storage. For example, the storage device 12 may include a disk drive, a drive array, an optical storage device, and/or a solid-state storage device. The storage device 12 may be programmable or flash-updatable and may be implemented to be applicable to various file systems, database structures, and/or the like.

The communication subsystem 15 may include, without limitation, modems, network cards (wireless or wired), infrared communication devices, and/or wireless communication devices and/or chipsets (e.g., Bluetooth devices, 802.11 devices, WiFi devices, WiMax devices, and/or cellular communication devices). The communication subsystem 15 may allow digital signature-related data, which is generated according to an embodiment of the inventive concept, to be exchanged (or transmitted) with networks, other computer systems/devices, and/or any other devices.

The memory 14 may include an operation system 14$a$ (e.g., an operating system) and may include an application 14$b$ including device drivers, executable libraries, and/or program code. The operation system 14$a$ and the application 14$b$ may be implemented as software elements by executing code and/or instructions by a computer (or a processor in a computer).

The random number generator 17 according to an embodiment of the inventive concept may be a device performing various arithmetic operations to generate an electronic signature on electronic data (or signature target data (i.e., data to be signed)) for security and may generate an electronic signature on electronic data based on a certain electronic signature algorithm method. The random number generator 17 may include a ring oscillator 18 to generate a random number.

The ring oscillator 18 may include a plurality of inverters connected in a chain form. For example, in the chain, an output of a first inverter is provided to an input of a second inverter, an output of the second inverter is provided to an input of a third inverter, etc. The plurality of inverters connected in a chain form may be referred to as an inverter chain. In an embodiment, the ring oscillator 18 generates a pulse that has a delay equal to the number of connected inverters, is output with an input inverted through the plurality of inverters, and has a certain period. The inverters included in the ring oscillator 18 may be skewed inverters configured differently in size ratio of p-channel metal oxide semiconductor (PMOS) and n-channel metal oxide semiconductor (NMOS). In an embodiment, an inverter may include a PMOS transistor and a NMOS transistor. In an embodiment, sizes of the PMOS and NMOS transistors may be among the inverters to realize the skewed inverters. A true random number generation based on the ring oscillator 18 may generate a random number by sampling through a method of inputting an output of the ring oscillator 18 as an input or clock signal of a D flip-flop by using the ring oscillator 18 as a random source. However, the output of the ring oscillator 18 may be affected by noise and thus a clock value of the clock signal changes faster or slower than a period. Thus, the output may become irregular, and the quality of the random number may vary according to a jitter occurrence rate and frequency.

In an embodiment, the random number generator 17 generates a random number by using a collapse count. The oscillation of a pulse signal generated by the ring oscillator 18 may stop while the timing of the rising edge and falling edge of the pulse signal varies gradually due to a mismatch of the skewed inverter included in the ring oscillator 18. The collapse count may be the number of pulses until the oscillation of the ring oscillator 18 stops. The random number generator 17 may generate a random bit according to whether the collapse count is odd or even.

In an embodiment, the random number generator 17 may be implemented by hardware logic or may include a logic block designed by logic synthesis. Also, the random number generator 17 may include a software block implemented when a set of code and/or commands stored on a non-transitory computer-readable storage medium such as the storage device 12 are executed by the random number generator 17. In other embodiments, the storage medium may be provided as an installation package or a device separate from a computer device (e.g., a removable medium such as a compact disk or universal serial bus (USB) device) so as to be used to program or adapt a general-purpose computer with a set of code and/or commands stored therein). The set of code and/or commands may be in the form of executable code executable by the random number generator 17 and may be in the form of installable code and/or a source in the form of executable code during compilation and/or installation of the random number generator 17.

Figure 2B:
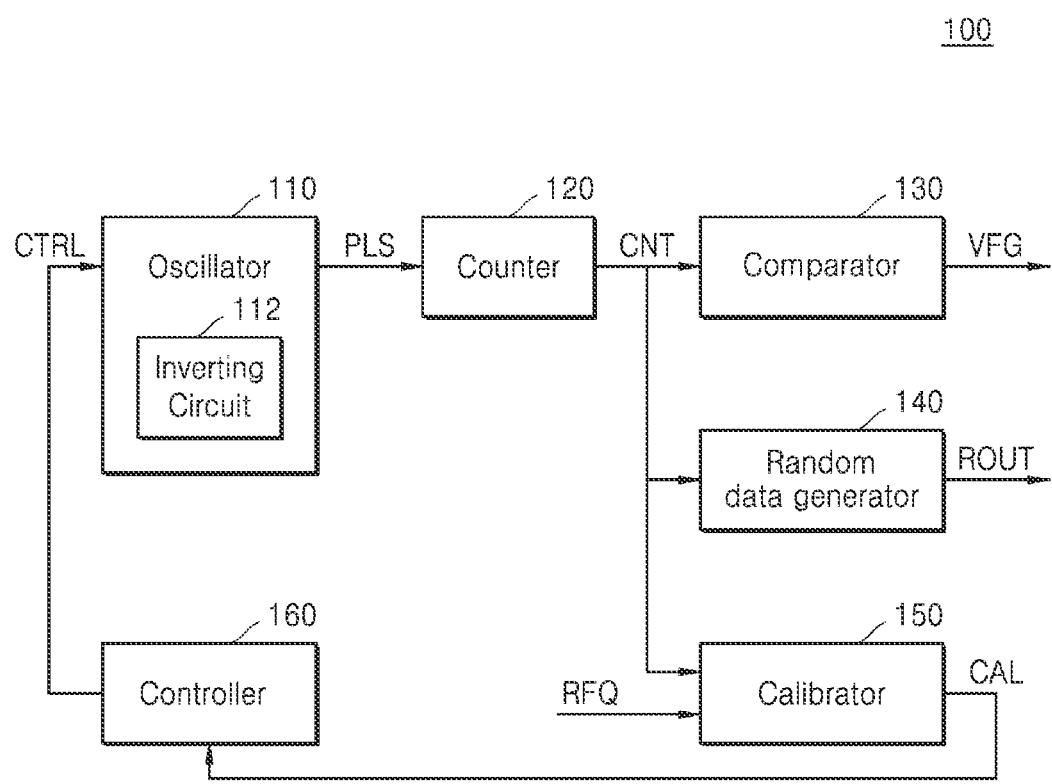
FIG. 2B is a block diagram illustrating a random number generator according to an embodiment of the inventive concept.

FIG. 2B is a block diagram illustrating a random number generator according to an embodiment of the inventive concept.

A random number generator 100 may include a ring oscillator 110, a counter 120, a comparator 130, a random data generator 140, a calibrator 150 (e.g., a calibration circuit), and a controller 160 (e.g., a control circuit).

The ring oscillator 110 may include a plurality of inverters. The ring oscillator 110 may include a plurality of inverters connected in a chain form and may generate a pulse PLS that has a delay equal to the number of connected inverters, is output with an input inverted through the plurality of inverters, and has a certain period. The ring oscillator 110 may include an inverting circuit 112. The inverting circuit 112 may include a multiplexer (not illustrated) and a phase inverter (not illustrated). The ring oscillator 110 may determine whether to use the phase inverter when generating a pulse PLS through the multiplexer included in the inverting circuit 112. For example, the ring oscillator 110 may determine whether to provide an output of the phase inverter to the plurality of inverters. In an embodiment, the ring oscillator 110 generates a pulse PLS by using a plurality of inverters connected in a chain during a first mode and may generate a pulse PLS by using a configuration in which an inverter is added to the chain during a second mode. In an embodiment, the phase inverter may include at least one inverter.

The counter 120 may count the number CNT of pulses PLS generated by the ring oscillator 110. The counter 120 may include a plurality of flip-flops, and the number of flip-flops in the counter 120 may vary according to the range of the number CNT of pulses PLS to be counted by the counter 120. The collapse count may be the number CNT of pulses PLS generated by the ring oscillator 110.

The comparator 130 may determine whether the collapse count generated by the counter 120 is within a suitable range. The comparator 130 may determine whether an input value is within a valid range based on an upper limit value and a lower limit value and may output a valid flag VFG. For example, the comparator 130 may output the valid flag VFG logic high when the collapse count is between a preset upper limit value and a preset lower limit value and may output the valid flag VFG as a logic low otherwise.

The random data generator 140 may generate a random bit based on the collapse count generated by the counter 120. The random data generator 140 may generate and output a plurality of random bits. Random data output ROUT provided by the random data generator 140 may include a collapse count or a random bit.

The calibrator 150 may readjust the frequency of a pulse PLS generated by the ring oscillator 110 by comparing the frequency of the pulse PLS generated with a reference frequency RFQ. For example, the calibrator 150 may compare the number CNT of pulses PLS generated by the ring oscillator 110 during a preset period with the number of pulses of a reference clock signal having the reference frequency RFQ. The calibrator 150 may generate a calibration signal CAL for readjusting the frequency of a pulse PLS generated by the ring oscillator 110. The calibration signal CAL may be generated by comparing the number CNT of pulses PLS counted during a period with a number of pulses of the reference clock signal that occur during the same period.

The controller 160 may generate a control signal CTRL and a clock signal to control the random number generator 100. The controller 160 may provide the control signal CTRL and the clock signal to the ring oscillator 110. The ring oscillator 110 may generate a pulse PLS having a certain period based on the received control signal CTRL and clock signal. The controller 160 may receive the calibration signal CAL generated by the calibrator 150, to generate the control signal CTRL to be provided to the ring oscillator 110. The controller 160 may set an upper limit value or a lower limit value for determining whether the collapse count is within a suitable range in the comparator 130.

Figure 3A:
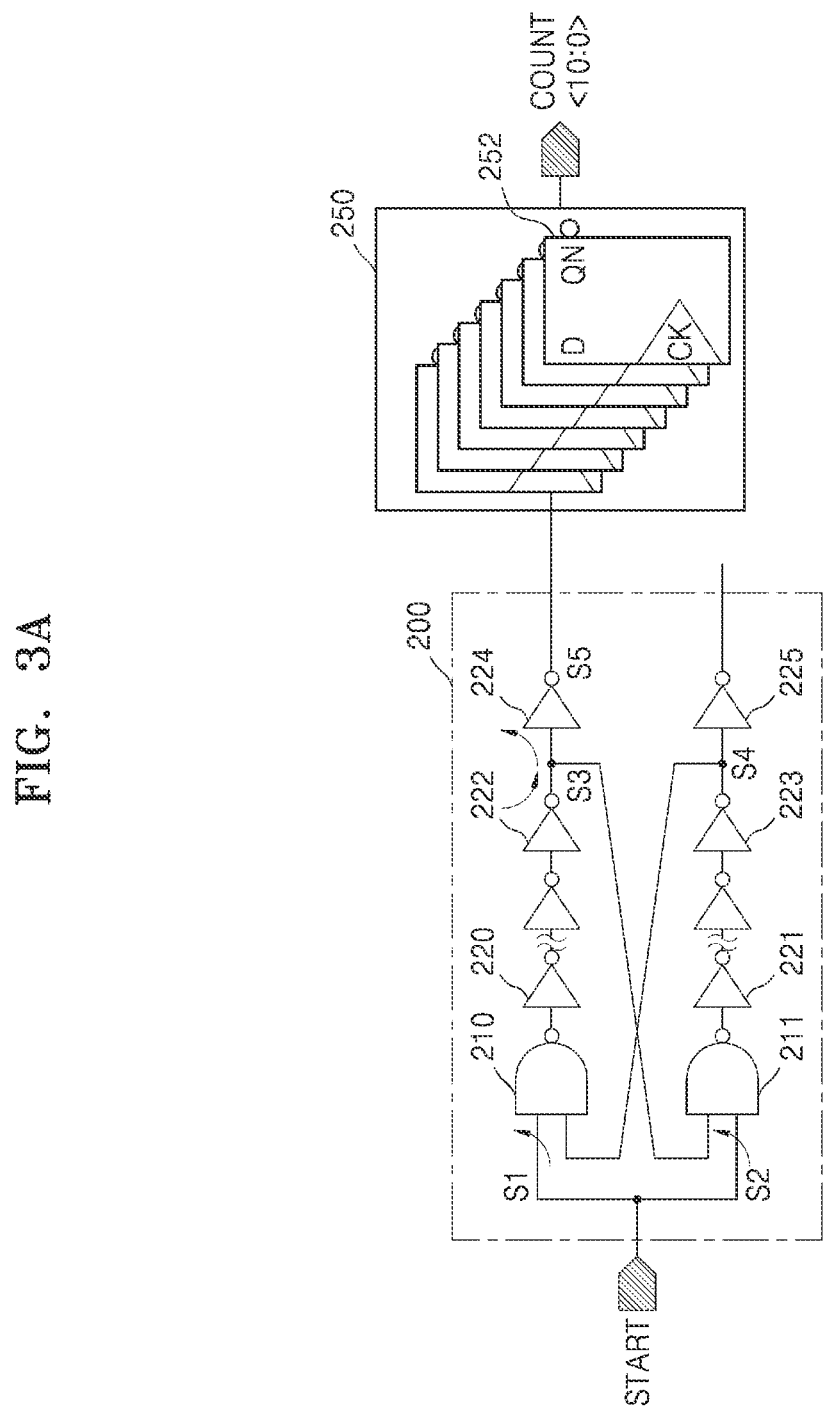
FIG. 3A is a diagram illustrating a structure of a ring oscillator according to an embodiment of the inventive concept.
Figure 3B:
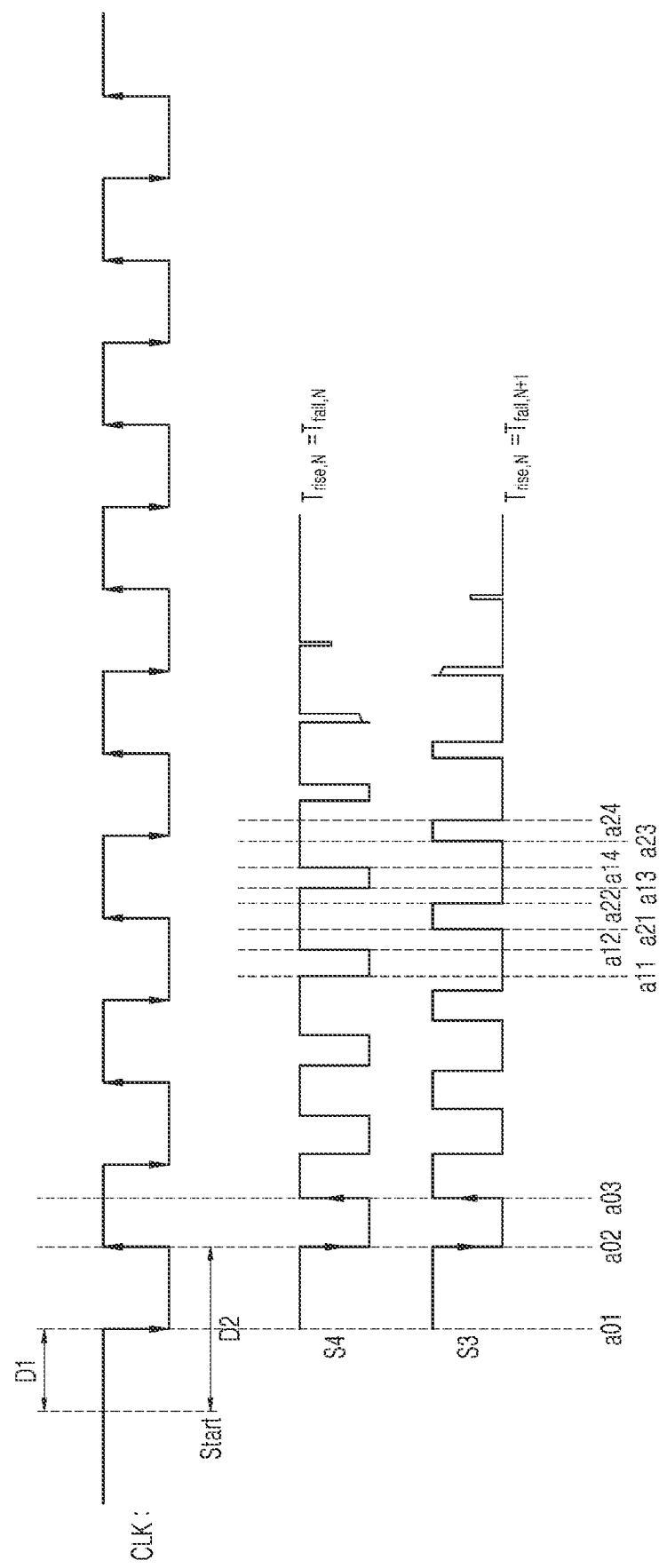
FIG. 3B is a diagram for describing a signal generated by the ring oscillator.

FIG. 3A is a diagram illustrating a structure of a ring oscillator according to an embodiment of the inventive concept, and FIG. 3B is a diagram for describing a signal generated by the ring oscillator.

Referring to FIG. 3A, a ring oscillator 200 may include a first NAND gate 210, a second NAND gate 211, a first inverter 220, a second inverter 221, a third inverter 222, a fourth inverter 223, a fifth inverter 224, and a sixth inverter 225. The ring oscillator 200 may further include a plurality of inverters between the first inverter 220 and the third inverter 222 and may further include a plurality of inverters between the second inverter 221 and the fourth inverter 223. An inverter chain configured from the first inverter 220 to the third inverter 222 of the ring oscillator 200 may include an even number of inverters, and an input signal of the first inverter 220 may be inverted and output by the third inverter 222 after being delayed through a plurality of inverters. The inverter included in the ring oscillator 200 may be a skewed inverter, and a clock signal input to the first inverter 220 may be inverted and output by the third inverter 222 after a rising edge and a falling edge thereof are delayed sequentially and differently. A signal S3 output from the third inverter 222 may be provided as an input signal to the second NAND gate 211.

An inverter chain configured from the second inverter 221 to the fourth inverter 223 of the ring oscillator 200 may include an even number of inverters, and an input signal of the second inverter 221 may be inverted and output by the fourth inverter 223 after being delayed through a plurality of inverters. The inverter included in the ring oscillator 200 may be a skewed inverter, and a signal input to the second inverter 221 may be inverted and output by the fourth inverter 223 after a rising edge and a falling edge thereof are delayed sequentially and differently. A signal S4 output from the fourth inverter 223 may be provided as an input signal to the first NAND gate 210.

For example, the signal S3 output from the third inverter 222 of the ring oscillator 200 may be inverted by the fifth inverter 224 and then provided as a pulse signal S5 to the outside. A signal output from the sixth inverter 225 of the ring oscillator 200 may be connected to another counter or another device.

The pulse signal S5 generated by the ring oscillator 200 may be provided to a counter 250. The counter 250 may count the number of pulses generated by the ring oscillator 200. For example, the counter 250 may count the number of pulses that occur during a certain period. The counter 250 may include a plurality of flip-flops 252, and the number of flip-flops 252 in the counter 250 may vary according to the range of the number of cell pulses used by the counter 250. The collapse count may be the number of pulses generated by the counter 250.

For example, referring to FIGS. 3A and 3B, the ring oscillator 200 may receive a clock signal CLK as an input signal START. In the ring oscillator 200, a first period D2 of the input clock signal CLK may be used as an input signal. For example, the clock signal CLK may fall from logic high to logic low at a first time a01 and rise from logic low to logic high at a second time a02, and the ring oscillator 200 may start to operate at the second time a02.

A first input S1 of the first NAND gate 210 may change from logic low to logic high before the operation of the ring oscillator 200 starts when the operation of the ring oscillator 200 starts. A second input S4 of the first NAND gate 210 may be maintained at a logic high before the operation of the ring oscillator 200 starts and may oscillate to logic low and logic high after the operation of the ring oscillator 200 starts. For example, the first input S1 of the first NAND gate 210 may be maintained at a logic high after the operation of the ring oscillator 200 starts, and the second input S4 of the first NAND gate 210 may change from logic high to logic low at the second time a02 when the operation of the ring oscillator 200 starts and may change from logic low to logic high at a third time a03 when a signal output from the second NAND gate 211 passes through the fourth inverter 223.

A first input S2 of the second NAND gate 211 may change from logic low to logic high before the operation of the ring oscillator 200 starts when the operation of the ring oscillator 200 starts, and a second input S3 of the second NAND gate 211 may be maintained at a logic high before the operation of the ring oscillator 200 starts and may oscillate to logic low and logic high after the operation of the ring oscillator 200 starts. For example, the first input S2 of the second NAND gate 211 may be maintained at a logic high after the operation of the ring oscillator 200 starts, and the second input S3 of the second NAND gate 211 may change from a logic high to a logic low at the second time a02 when the operation of the ring oscillator 200 starts and may change from logic low to logic high at the third time a03 when the signal output from the second NAND gate 211 passes through the fourth inverter 223.

The second input S4 of the first NAND gate 210 and the second input S3 of the second NAND gate 211 may oscillate with a similar period in the initial operation of the ring oscillator 200, but a duty ratio thereof may vary due to a mismatch of the skewed inverter included in the ring oscillator 200. For example, as for the second input S3 of the second NAND gate 211, logic high and logic low may be maintained at a 1:1 ratio in the initial stage, but the logic high ratio during the oscillation may decrease gradually compared to the logic low ratio. As for the second input S3 of the second NAND gate 211, a logic high period from a 23rd time a23 to a 24th time a24 may be shorter than a logic high period from a 21st time a21 to a 22nd time a22. When the ring oscillator 200 continues to oscillate, the second input S3 of the second NAND gate 211 may be eventually fixed at a logic low and the oscillation may end.

For example, as for the second input S4 of the first NAND gate 210, logic high and logic low may be maintained at a 1:1 ratio in the initial stage, but the logic low ratio during the oscillation may decrease gradually compared to the logic high ratio. As for the second input S4 of the first NAND gate 210, a logic low period from a 13th time a13 to a 14th time a14 may be shorter than a logic low period from an 11th time a11 to a 12th time a12. When the ring oscillator 200 continues to oscillate, the second input S4 of the first NAND gate 210 may be eventually fixed at a logic high and the oscillation may end.

For example, the counter 250 may measure the number of pulses while the second input S3 of the second NAND gate 211 oscillates. The pulse measured by the counter 250 may be an output signal S5 obtained by inverting the second input S3 of the second NAND gate 211. The random number generator may generate a random bit according to whether the number of pulses measured by the counter 250 is odd or even.

Figure 4:
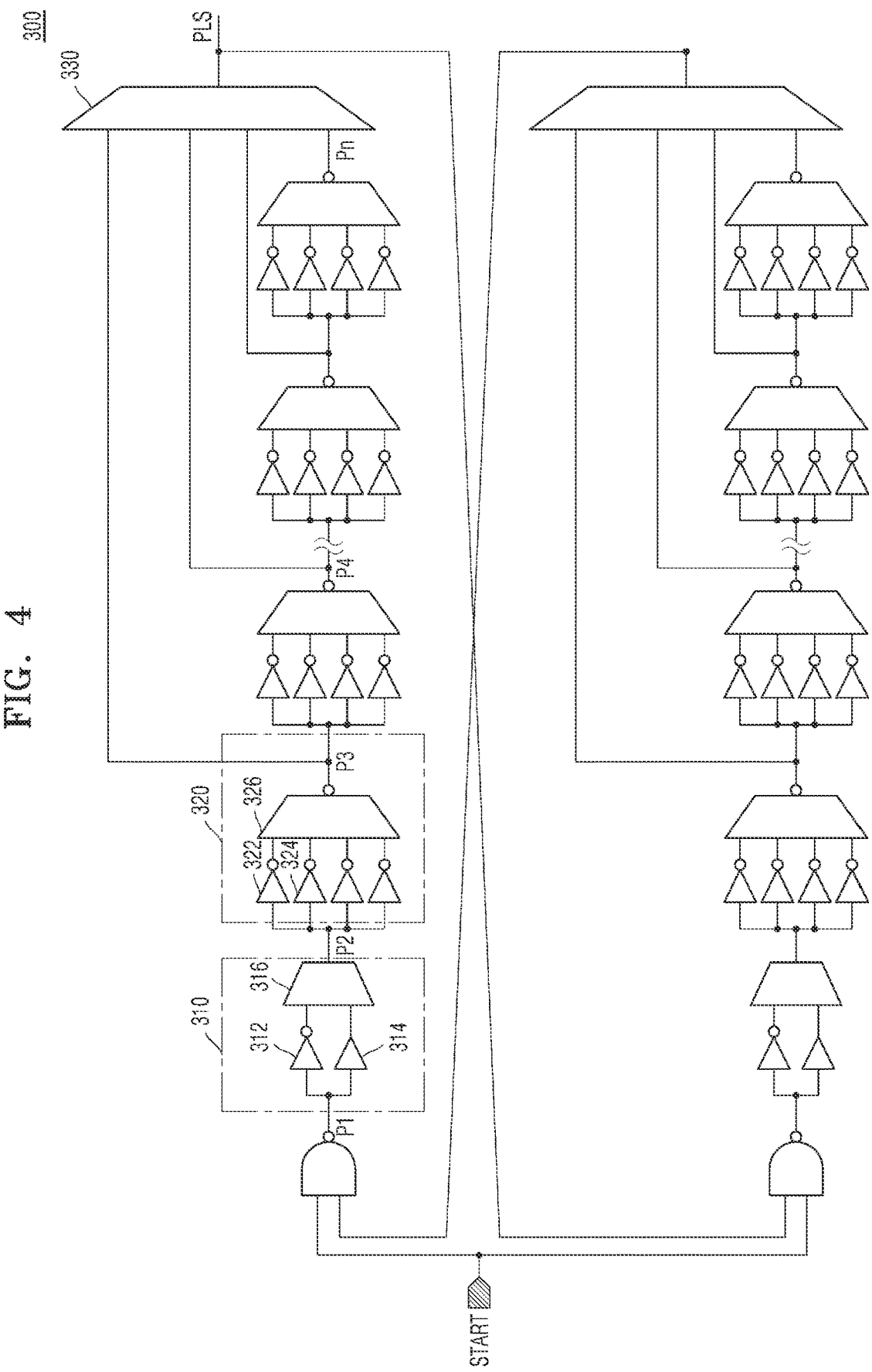
FIG. 4 is a diagram for describing a random number generator according to an embodiment of the inventive concept.

FIG. 4 is a diagram for describing a random number generator according to an embodiment of the inventive concept.

A ring oscillator 300 may include an inverter chain including a plurality of inverters and may further include an inversion selecting circuit 310.

The inversion selecting circuit 310 may include a phase inverter 312, a buffer 314, and a first multiplexer 316. The phase inverter 312 may be an inverter or a skewed inverter. The inversion selecting circuit 310 may select the phase inverter 312 through the first multiplexer 316 in a first operation mode for measuring the frequency of the ring oscillator 300 and may select the buffer 314 through the first multiplexer 316 in a second operation mode for generating a random number. In the first operation mode, the inversion selecting circuit 310 may invert a first signal P1 and provide the result thereof as a second signal P2. The inversion selecting circuit 310 may provide the first signal P1 as the second signal P2 in the second operation mode. For example, the second signal P2 may be the same as the first signal P1 in the second operation mode but delayed. In an embodiment of the first operation mode, an output signal PLS continues to oscillate and the frequency of the ring oscillator 300 is measured using the oscillating output signal PLS.

The ring oscillator 300 may include an inverter or an inverter selecting module 320. The inverter selecting module 320 may include a plurality of skewed inverters and a second multiplexer 326. For example, a first skewed inverter 322 and a second skewed inverter 324 may be skewed inverters that are configured differently in size ratio of p-channel metal oxide semiconductor (PMOS) and n-channel metal oxide semiconductor (NMOS) and are different in the delay time of a rising edge and the delay time of a falling edge. The second multiplexer 326 may select one of the plurality of skewed inverters to adjust the collapse count or the dispersion of the collapse count. The ring oscillator 300 may include all the inverters in the form of the inverter selecting module 320 to adjust the collapse count or the dispersion of the collapse count. For example, when the collapse count or the dispersion of the collapse count is outside a preset range, the ring oscillator 300 may select the second skewed inverter 324 instead of the first skewed inverter 322 by using the second multiplexer 326.

The ring oscillator 300 may include a third multiplexer 330 to adjust the frequency of the output signal PLS. The third multiplexer 330 may select one of a first inverter selecting module output P3, a second inverter selecting module output P4, and an n-th inverter selecting module output Pn included in the ring oscillator 300 and output the selected one as the output signal PLS. The ring oscillator 300 may compare the output signal PLS with a separate reference clock signal to adjust the frequency of the output signal PLS. The ring oscillator 300 may be controlled by a controller or a control module included in a random number generator.

Figure 5:
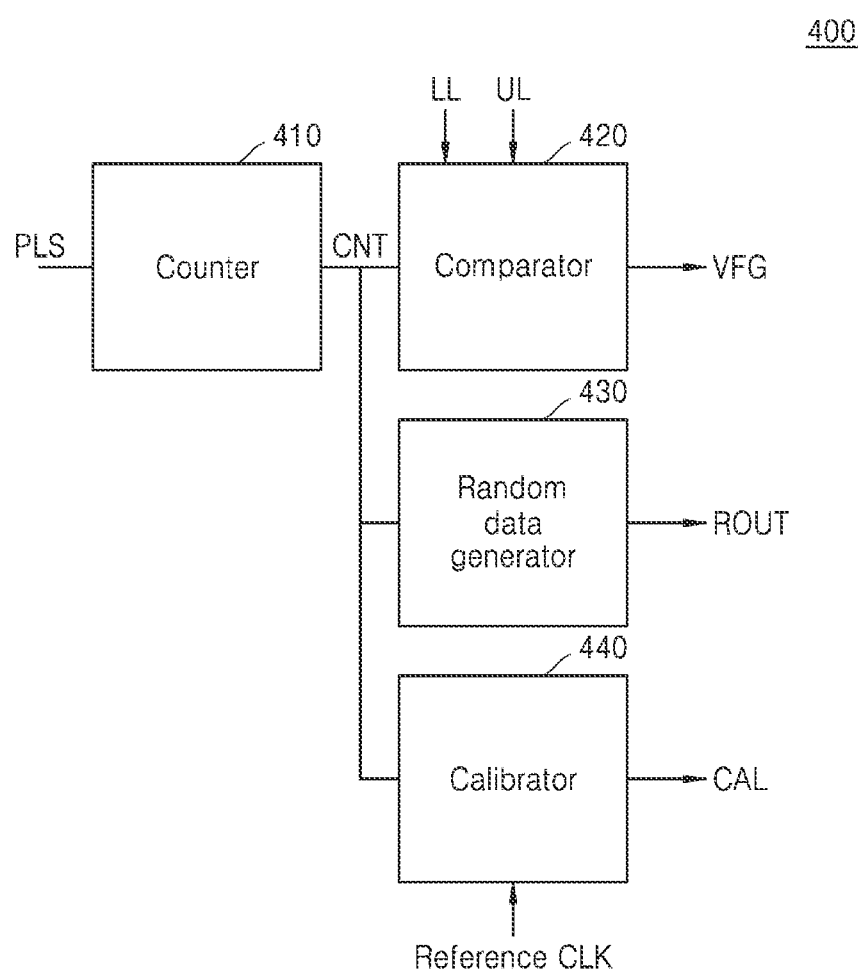
FIG. 5 is a diagram for describing a random number generator according to an embodiment of the inventive concept.

FIG. 5 is a diagram for describing a random number generator according to an embodiment of the inventive concept.

The random number generator may include a counter 410, a comparator 420, a random data generator 430, and a calibrator 440 to process an output signal of a ring oscillator.

The counter 410 may count the number CNT of pulses PLS generated by the ring oscillator. The counter 410 may include a plurality of flip-flops, and the number of flip-flops in the counter 410 may vary according to the range of the number CNT of cell pulses PLS to be counted by the counter 410. The collapse count may be the number CNT of pulses PLS generated by the oscillator 410.

The comparator 420 may determine whether the collapse count generated by the counter 410 is within a suitable range. The comparator 420 may determine whether an input value is within a valid range based on an upper limit value UL and a lower limit value LL and may output a valid flag VFG. For example, the comparator 420 may output the valid flag VFG logic high when the collapse count is between a preset upper limit value UL and a preset lower limit value LL and may output the valid flag VFG logic low otherwise.

The random data generator 430 may generate a random bit based on the collapse count generated by the counter 410. The random data generator 430 may generate and output a plurality of random bits. Random data output ROUT provided by the random data generator 430 may include a collapse count or a random bit.

The calibrator 440 may readjust the frequency of a pulse PLS generated by the ring oscillator by comparison with the frequency of a pulse PLS generated by the ring oscillator with a reference frequency Reference CLK as an input. The calibrator 440 may generate a calibration signal CAL for readjusting the frequency of a pulse PLS generated by the ring oscillator. The calibration signal CAL may be generated by comparing the frequency of a pulse PLS with a frequency of the Reference CLK.

Figure 6:
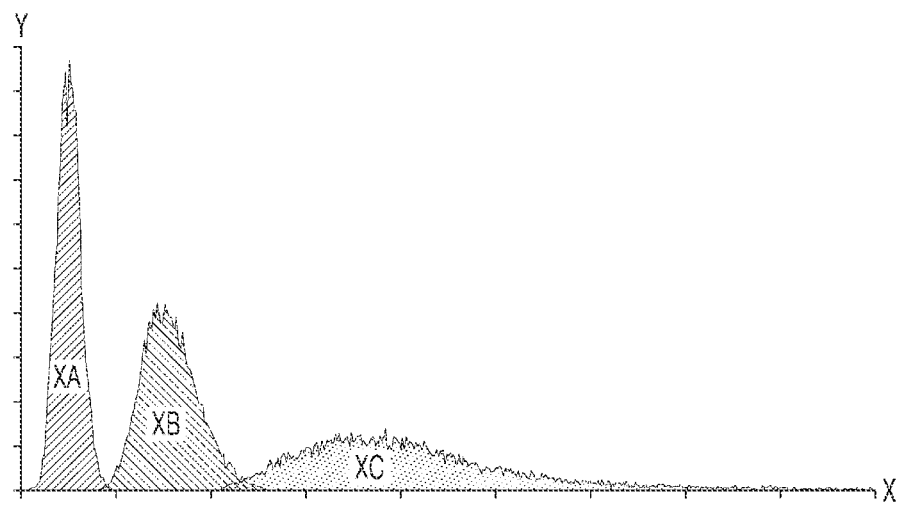
FIG. 6 is a diagram for describing a collapse count generated by a random number generator according to an embodiment of the inventive concept.

FIG. 6 is a diagram for describing a collapse count generated by a random number generator according to an embodiment of the inventive concept.

The random performance may increase as the collapse count generated by the random number generator increases. Referring to FIG. 6, the entropy about which one of an odd number and an even number will appear may increase because the dispersion of the collapse count increases as the collapse count increases. In the graph of FIG. 6, the X axis represents the collapse count, and the Y axis represents the occurrence frequency. For example, as for a first collapse count dispersion XA generated by the random number generator, an average collapse count may be 100 and a collapse count dispersion may be small. As for a second collapse count dispersion XB generated by the random number generator, an average collapse count may be 200 and a collapse count dispersion may be greater than the first collapse count dispersion XA. As for a third collapse count dispersion XC generated by the random number generator, an average collapse count may be 400 and a collapse count dispersion may be greater than the second collapse count dispersion XB.

However, when the collapse count increases, because the time taken for the random number generator to generate one random bit increases, the random performance may increase but the bit rate performance, which is the rate at which the random bit is generated, may decrease. Thus, it may be necessary to suitably calibrate the collapse count and the output signal frequency of the ring oscillator to optimize the random performance and bit rate performance of the random number generator.

Figure 7:
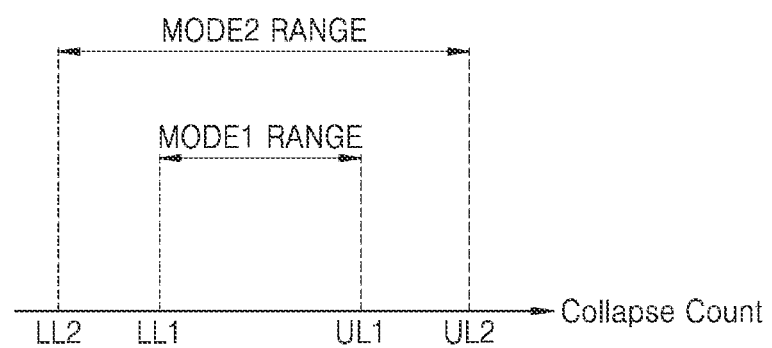
FIG. 7 is a diagram for describing a suitable range of a collapse count generated by a random number generator according to an embodiment of the inventive concept.

FIG. 7 is a diagram for describing a suitable range of a collapse count generated by a random number generator according to an embodiment of the inventive concept.

As for the range of the collapse count for optimizing the random performance and bit rate performance of the random number generator, a first collapse count range MODE1 RANGE corresponding to the initial operation and a second collapse count range MODE2 RANGE corresponding to the random number generation operation of the ring oscillator may be managed separately. For example, when the random number generator trims the ring oscillator in the initial stage, the trim may be performed based on the first collapse count range MODE1 RANGE that is a strict range. As long as the random performance and the bitrate performance are ensured during the random number generation, the trim may be performed based on the second collapse count range MODE2 RANGE that is a wide range, thereby reducing the number of unnecessary retrims during the operation. An upper limit value UL1 of the first collapse count range MODE1 RANGE may be less than an upper limit value UL2 of the second collapse count range MODE2 RANGE, and a lower limit value LL1 of the first collapse count range MODE1 RANGE may be greater than a lower limit value LL2 of the second collapse count range MODE2 RANGE.

Figure 8:
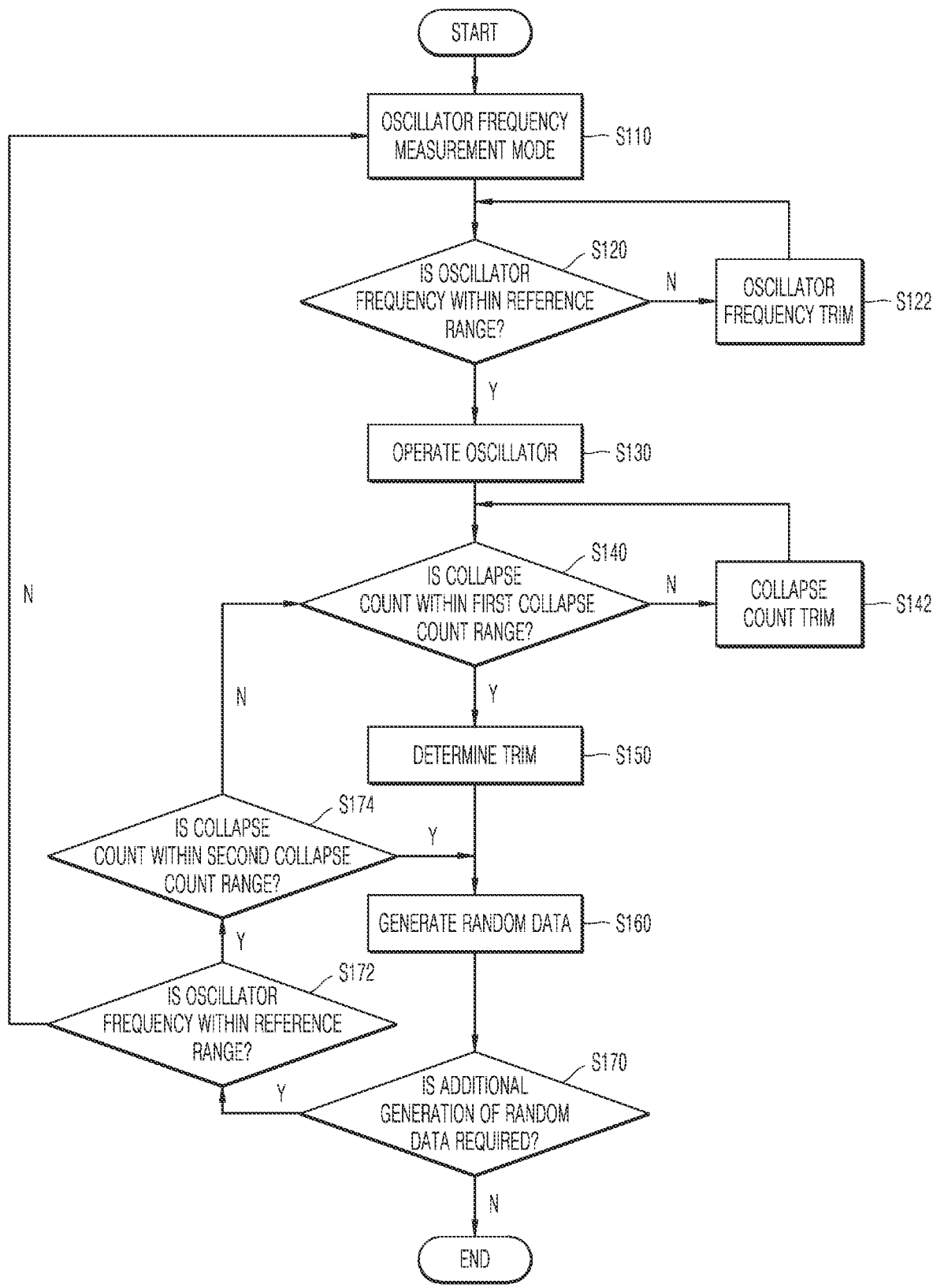
FIG. 8 is a flowchart for describing an operation of a random number generator according to an embodiment of the inventive concept.

FIG. 8 is a flowchart for describing an operation of a random number generator according to an embodiment of the inventive concept.

The random number generator operates in a first operation mode, which is a ring oscillator frequency measurement mode, to operate at a suitable frequency for random number generation (S110). The random number generator may invert and output a signal through an inversion selecting circuit including a phase inverter to operate in the first operation mode. The random number generator may select the phase inverter through a multiplexer to invert a signal. When the random number generator selects the phase inverter, the number of inverters included in an inverter chain of the ring oscillator may change from an even number to an odd number and continuous oscillation may occur. The frequency of the ring oscillator may be measured during the first operation mode.

The random number generator determines whether the measured ring oscillator frequency is within a reference range (S120). The random number generator may adjust the frequency of a pulse signal generated by the ring oscillator by comparing the pulse signal of the ring oscillator, which oscillates continuously, with a reference clock signal.

When the measured ring oscillator frequency is outside the reference range, the random number generator performs a ring oscillator frequency trim (S122).

When the measured ring oscillator frequency is within the reference range, the random number generator operates the ring oscillator in a second operation mode for generating a random number (S130). The random number generator may select a buffer instead of the phase inverter selected in the first operation mode through the multiplexer. The number of inverters included in the inverter chain of the ring oscillator may change from an odd number to an even number, and a pulse signal for generating a random number may be generated.

The random number generator determines whether the generated collapse count is within a first collapse count range corresponding to the initial operation of the ring oscillator (S140). As for the range of the collapse count for optimizing the random performance and bit rate performance of the random number generator, a first collapse count range corresponding to the initial operation and a second collapse count range corresponding to the random number generation operation may be managed separately. For example, when the random number generator trims the ring oscillator in the initial stage, the trim may be performed based on the first collapse count range that is a strict range. As long as the random performance and the bitrate performance are ensured during the random number generation, the trim may be performed based on the second collapse count range that is a wide range, thereby reducing the number of unnecessary retrims during the operation.

The random number generator performs a collapse count trim when the generated collapse count is outside the first collapse count range (S142). The random number generator may select at least one of a plurality of skewed inverters included in the random number generator through the multiplexer to perform a collapse count trim.

The random number generator determines the trim when the generated collapse count is within the first collapse count range (S150). For example, a collapse count trim is not performed when the generated collapse count is within the first collapse count range.

The random number generator generates random data (S160). The random number generator may generate a random bit based on the collapse count.

The random number generator may determine whether additional generation of random data is required (S170). The random number generator may generate a random bit based on the collapse count generated by the ring oscillator and may determine that additional generation of random data is needed, when a plurality of random bits are needed according to a random number size.

When additional generation of random data is needed, the random number generator may again determine whether the ring oscillator frequency is within the reference range (S172).

When the ring oscillator frequency is outside the reference range, the random number generator may again perform an operation of the ring oscillator frequency measurement mode (S110) operation.

When the ring oscillator frequency is within the reference range, the random number generator determines whether the generated collapse count is within the second collapse count range corresponding to the random number generation operation of the ring oscillator (S174).

The random number generator may immediately generate random data when the collapse count is within the second collapse count range (S160). When the collapse count is outside the second collapse count range, the random number generator may return to an operation (S140) for again performing a collapse count trim.

Figure 9:
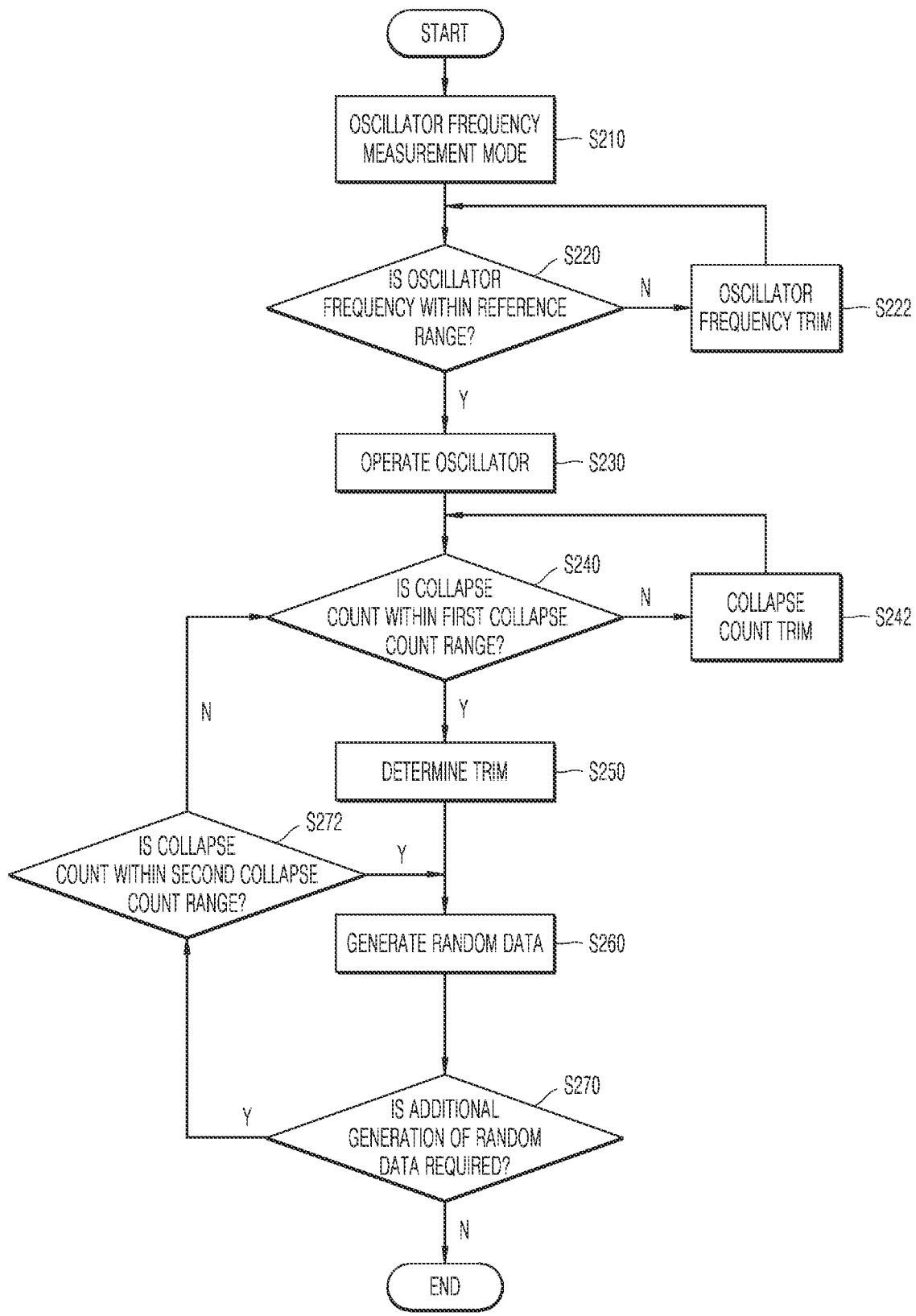
FIG. 9 is a flowchart for describing an operation of a random number generator according to an embodiment of the inventive concept.

FIG. 9 is a flowchart for describing an operation of a random number generator according to an embodiment of the inventive concept.

The random number generator operates in a first operation mode, which is a ring oscillator frequency measurement mode, to operate at a suitable frequency for random number generation (S210). The random number generator may invert and output a signal through an inversion selecting circuit including a phase inverter to operate in the first operation mode. The random number generator may select the phase inverter through a multiplexer to invert a signal. When the random number generator selects the phase inverter, the number of inverters included in an inverter chain of the ring oscillator may change from an even number to an odd number and continuous oscillation may occur. A frequency of the ring oscillator may be determined during the first operation mode.

The random number generator determines whether the measured ring oscillator frequency is within a reference range (S220). The random number generator may adjust the frequency of a pulse signal generated by the ring oscillator by comparing the pulse signal of the ring oscillator, which oscillates continuously, with a reference clock signal.

When the measured ring oscillator frequency is outside the reference range, the random number generator performs a ring oscillator frequency trim (S222).

When the measured ring oscillator frequency is within the reference range, the random number generator operates the ring oscillator in a second operation mode for generating a random number (S230). The random number generator may select a buffer instead of the phase inverter selected in the first operation mode through the multiplexer. The number of inverters included in the inverter chain of the ring oscillator may change from an odd number to an even number, and a pulse signal for generating a random number may be generated.

The random number generator determines whether the generated collapse count is within a first collapse count range corresponding to the initial operation of the ring oscillator (S240). As for the range of the collapse count for optimizing the random performance and bit rate performance of the random number generator, a first collapse count range corresponding to the initial operation and a second collapse count range corresponding to the random number generation operation may be managed separately. For example, when the random number generator trims the ring oscillator in the initial stage, the trim may be performed based on the first collapse count range that is a strict range. As long as the random performance and the bitrate performance are ensured during the random number generation, the trim may be performed based on the second collapse count range that is a wide range, thereby reducing the number of unnecessary retrims during the operation.

The random number generator performs a collapse count trim when the generated collapse count is outside the first collapse count range (S242). The random number generator may select at least one of a plurality of skewed inverters included in the random number generator through the multiplexer to perform a collapse count trim.

The random number generator determines the trim when the generated collapse count is within the first collapse count range (S250). For example, the collapse count trim is not performed when the when the generated collapse count is within the first collapse count range.

The random number generator generates random data (S260). The random number generator may generate a random bit based on the collapse count.

The random number generator determines whether additional generation of random data is required (S270). The random number generator may generate a random bit based on the collapse count generated by the ring oscillator and may determine that additional generation of random data is needed, when a plurality of random bits are needed according to a random number size.

When additional generation of random data is needed, the random number generator determines whether the generated collapse count is within the second collapse count range corresponding to the random number generation operation of the ring oscillator (S272).

The random number generator may immediately generate random data when the collapse count is within the second collapse count range (S260). When the collapse count is outside the second collapse count range, the random number generator may return to an operation (S240) for again performing a collapse count trim.

Figure 10:
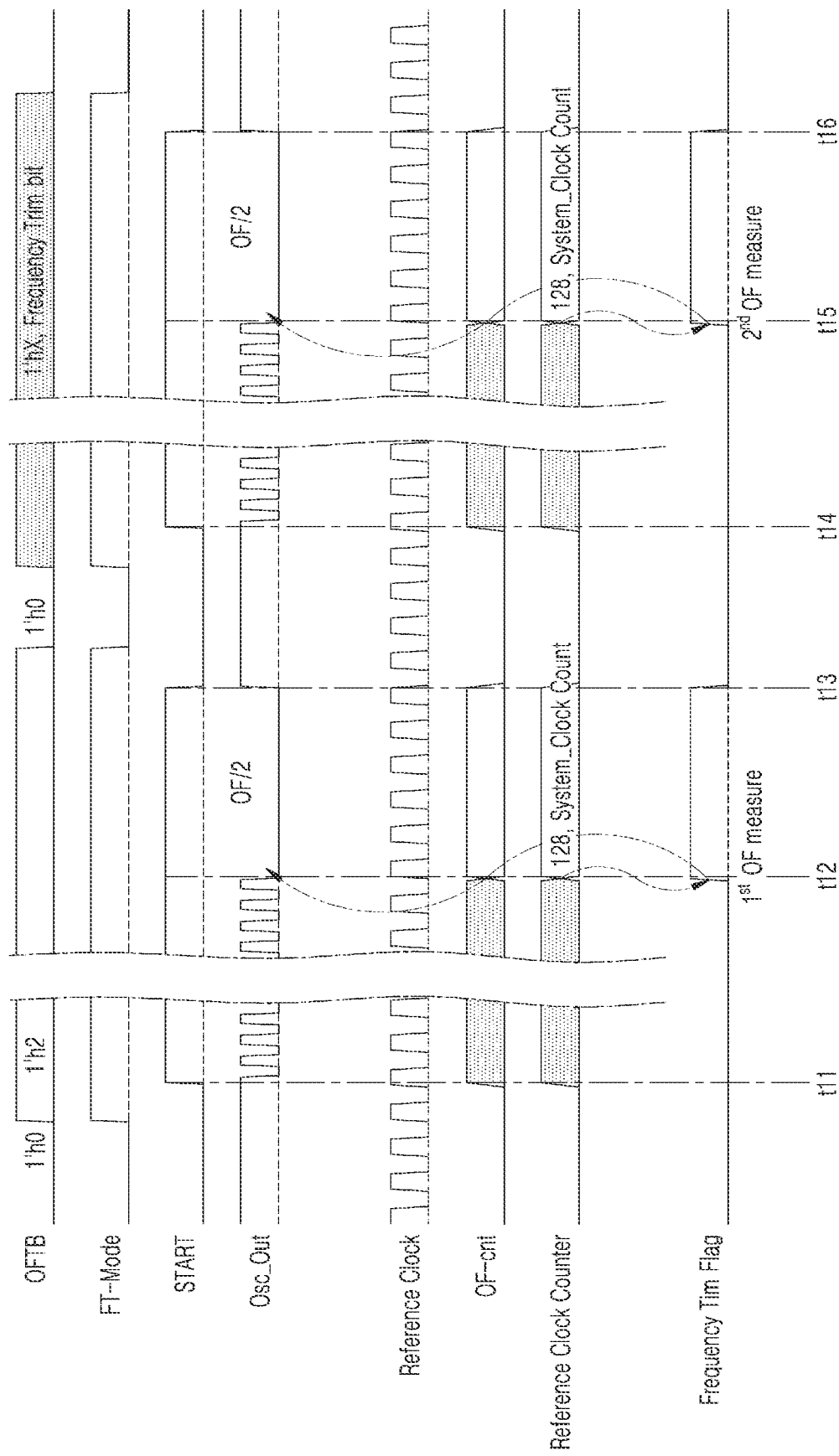
FIG. 10 is a diagram for describing a signal generated by a random number generator according to an embodiment of the inventive concept.

FIG. 10 is a diagram for describing a signal generated by a random number generator according to an embodiment of the inventive concept.

Referring to FIG. 10, the random number generator may operate in a first operation mode, which is a ring oscillator frequency measurement mode, in an initial stage of the operation. In the first operation mode, the random number generator may maintain a frequency trim mode (FT-Mode) signal at logic high and maintain an oscillator frequency trim bit (OFTB) at logic high.

The random number generator may start the oscillation of the ring oscillator when a start signal START changes from logic low to logic high at an 11th time t11. The random number generator may receive a reference clock signal Reference CLK to measure the frequency of a pulse signal Osc_Out of the ring oscillator.

The random number generator may measure the frequency of the pulse signal Osc_Out of the ring oscillator from the 11th time t11 to a 12th time t12. The random number generator may generate a count value OF_cnt of the pulse signal Osc_Out of the ring oscillator by using a counter and may simultaneously generate a count value Reference Clock Counter of the reference clock signal Reference CLK. The random number generator may determine whether to perform a frequency trim of the pulse signal Osc_Out of the ring oscillator based on the generated count value OF_cnt of the pulse signal Osc_Out of the ring oscillator and the count value Reference Clock Counter of the reference clock signal Reference CLK. The random number generator may output a frequency trim flag at logic high from the 12th time t12 to a 13th time t13 when it is determined that the frequency trim needs to be performed.

Based on the value of the frequency trim flag, the random number generator may again repeat the ring oscillator frequency measurement and trim from a 14th time t14 while maintaining the first operation mode.

Figure 11:
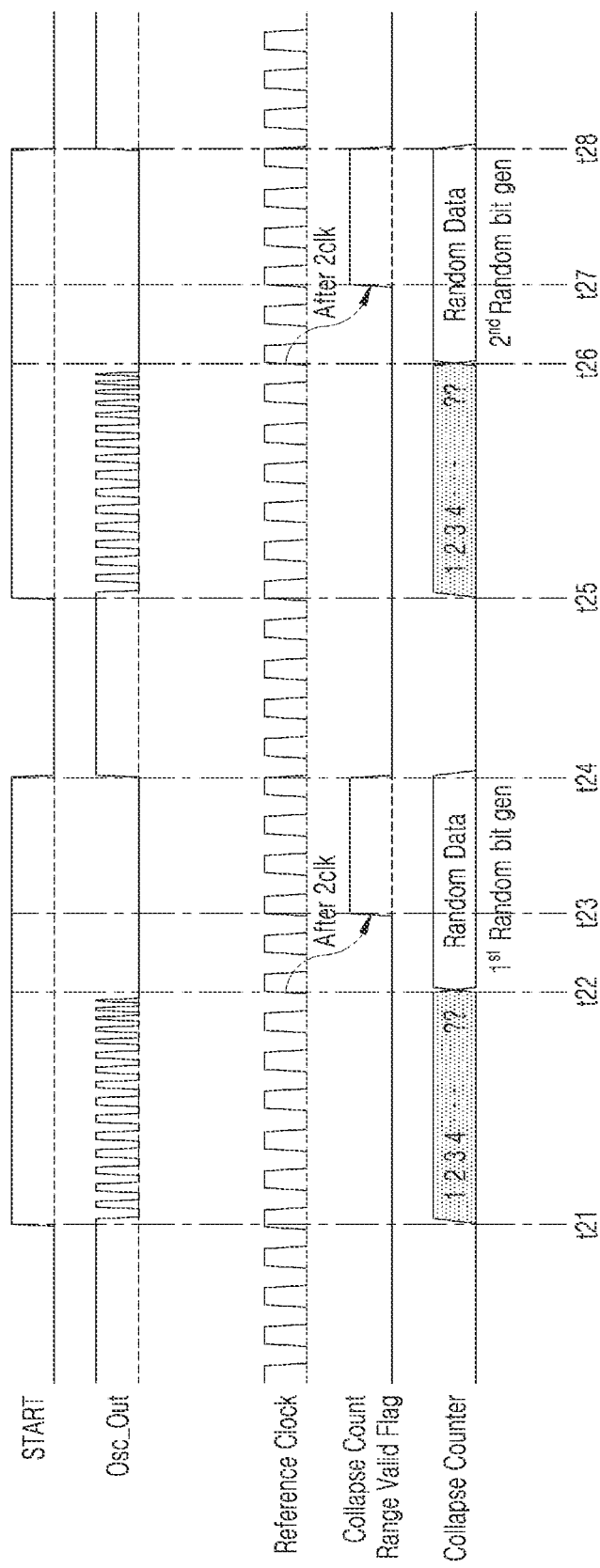
FIG. 11 is a diagram for describing a signal generated by a random number generator according to an embodiment of the inventive concept.

FIG. 11 is a diagram for describing a signal generated by a random number generator according to an embodiment of the inventive concept.

Referring to FIG. 11, the random number generator operates the ring oscillator in a second operation mode for generating a random number. The random number generator may start the oscillation of the ring oscillator when a start signal START changes from logic low to logic high at a 21st time t21. In the second operation mode, a pulse signal Osc_Out of the ring oscillator may stop after oscillating for a certain time.

The random number generator may measure the number of pulses or the collapse count (Collapse Counter) of the pulse signal Osc_Out of the ring oscillator. The random number generator may determine whether the collapse count range is satisfied based on the collapse count (Collapse Counter) measured at a 22nd time t22 when the oscillation ends. For example, when the collapse count is valid, a collapse count range valid flag (Collapse Count Range Valid Flg) may be output at logic high at a 23rd time t23 that is two clock signals after the 22nd time t22.

The random number generator may again perform a random number generation operation at a 25th time t25.

Figure 12:
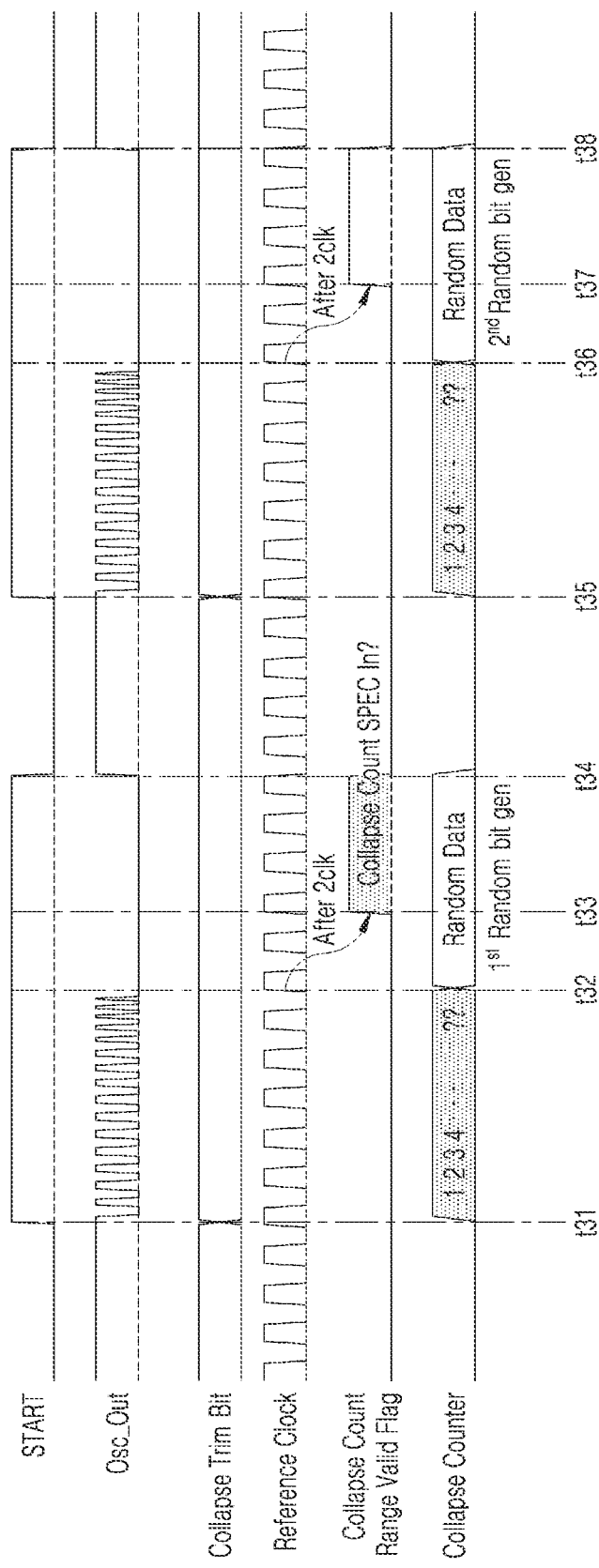
FIG. 12 is a diagram for describing a signal generated by a random number generator according to an embodiment of the inventive concept.

FIG. 12 is a diagram for describing a signal generated by a random number generator according to an embodiment of the inventive concept.

Referring to FIG. 12, the random number generator operates the ring oscillator in a second operation mode for generating a random number. The random number generator may start the oscillation of the ring oscillator when a start signal START changes from logic low to logic high at a $31^{st}$ time t31. In the second operation mode, a pulse signal Osc_Out of the ring oscillator may stop after oscillating for a certain time.

The random number generator may measure the number of pulses or the collapse count (Collapse Counter) of the pulse signal Osc_Out of the ring oscillator. The random number generator may determine whether the collapse count range is satisfied based on the collapse count (Collapse Counter) measured at a 32nd time t32 when the oscillation ends. For example, when the collapse count is outside a preset collapse count range, the collapse count range determination result may be output as a collapse count range valid flag (Collapse Count Range Valid Flg) signal at a 33rd time t33 that is 2 clocks after the 32nd time t32. The random number generator may change the collapse trim bit and perform a collapse count trim operation.

Figure 13:
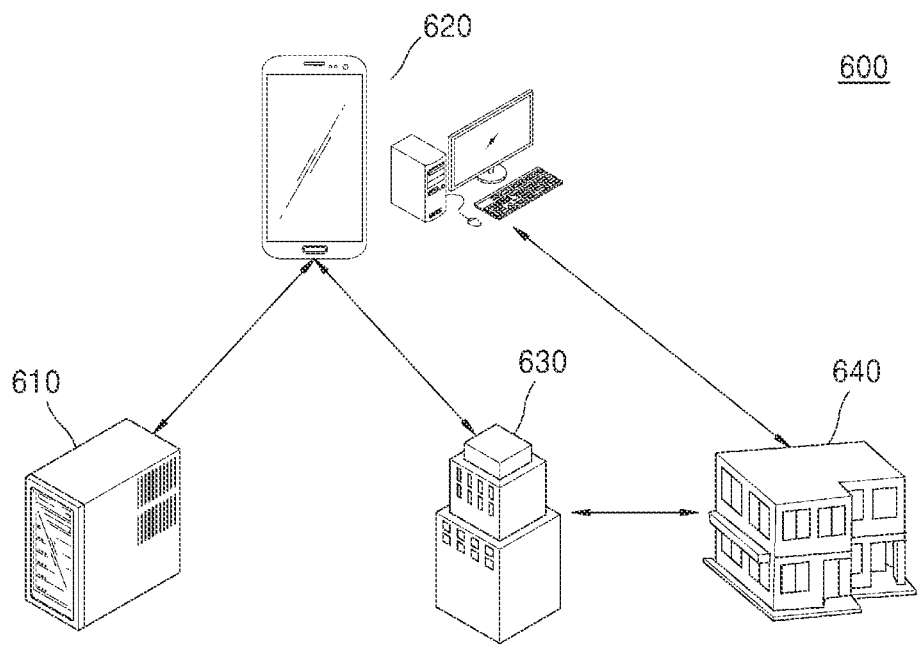
FIG. 13 is a diagram illustrating an electronic signature service system according to an embodiment of the inventive concept.

FIG. 13 is a diagram illustrating an electronic signature service system 600 according to an embodiment of the inventive concept.

Referring to FIG. 13, the electronic signature service system 600 according to an embodiment may include a user terminal 620, an electronic signature service server 610 that stores data for generating a user's electronic signature and provides an electronic signature service to the user, an electronic signature using server 630 using an electronic signature, and an authentication server 640 for authenticating an electronic signature.

The electronic signature using server 630 may refer to a server operated by an institution using an electronic signature. The electronic signature using server 630 may include, but is not limited to, a bank server, a server operated by a public institution, and/or a server providing an electronic commerce service. The electronic signature using server 630 may issue an electronic document requiring a user's authentication, that is, a signature target document (i.e., a document to be signed). The electronic signature using server 630 may transmit signature target data derived from the signature target document to the user terminal 620. The signature target data may include the original data of the signature target document as it is or may include data obtained by processing the original data of the signature target document to be suitable for encryption. The electronic signature using server 630 may request the user terminal 620 for an electronic signature on the signature target data.

The authentication server 640 may refer to a server operated by an authorized authentication institution that issues and manages an authentication certificate for verification of an electronic signature. Examples of the authorized authentication institution may include Korea Financial Telecommunications & Clearings Institute, Korea Information Certificate Authority, Korea Securities Computing Corporation, Korea Electronic Certification Authority, National Computerization Agency, and Korea Trade Network.

The user terminal 620 may refer to a device used by the user having the authority to enter an electronic signature. The user terminal may include, but is not limited to, a smart phone, a tablet PC, and/or a laptop. The user terminal 620 may include a communication unit capable of communicating with the electronic signature using server 630 and the electronic signature service server 610. The user terminal 620 may receive signature target data and an electronic signature request for the signature target data from the electronic signature using server 630.

The user terminal 620 may generate a random number satisfying the random number condition in the electronic signature algorithm method of the user terminal 620 through a random number generator whose random performance and bit rate performance are optimized for a random number required when generating an electronic signature according to the embodiments described in FIG. 1 and the like.

The user terminal 620 may request the electronic signature service server 610 to generate the electronic signature, instead of directly generating the electronic signature. When necessary, the user terminal 620 may process the signature target data into a format that may be easily electronically signed and then transmit a request for an electronic signature on the processed signature target data to the electronic signature service server 610. In this case, the digital signature service server 610 may also perform the random number generation operation according to the embodiments described in FIG. 1 and the like.

When receiving the electronic signature from the electronic signature service server 610, the user terminal 620 may generate an electronic signature text by using the electronic signature. The electronic signature may be written in a format that may be verified by the digital signature using server 630 or the authentication server 640. The user terminal 620 may transmit the generated electronic signature text to the electronic signature using server 630.

Figure 14:
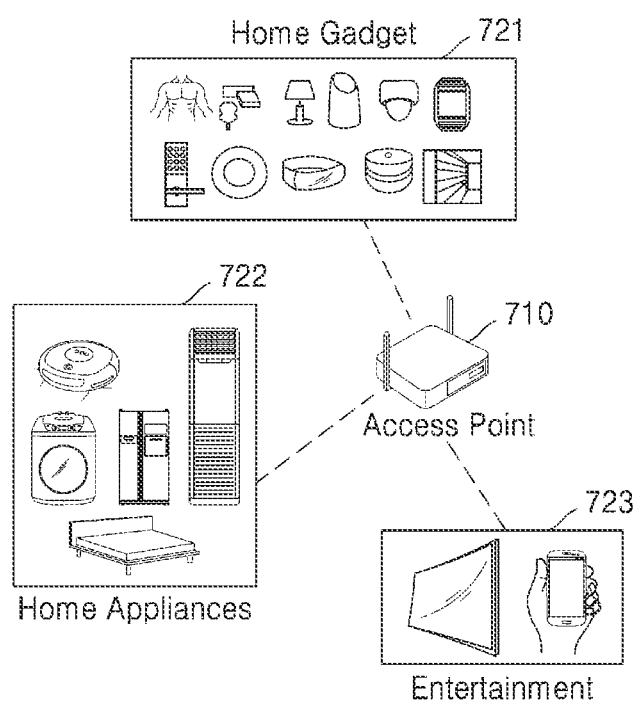
FIG. 14 illustrates examples of a communication device performing security verification through an electronic signature generated according to an embodiment of the inventive concept.

FIG. 14 illustrates examples of a communication device performing security verification through an electronic signature generated according to an embodiment of the inventive concept. FIG. 14 illustrates an example in which various wireless communication devices communicate with each other in a wireless communication system using WLAN.

Referring to FIG. 14, a home gadget 721, a home appliance 722, an entertainment device 723, and an access point (AP) 710 may constitute an Internet of Things (IoT) network system. Each of the home gadget 721, the home appliance 722, the entertainment device 723, and the AP 710 may perform a random number generation operation according to an embodiment of the inventive concept and generate an electronic signature by using the random number. The security between devices 710, 721, 722, and 723 constituting the IoT network system may be enhanced through each generated electronic signature. The home gadget 721, the home appliance 722, and the entertainment device 723 may wirelessly communicate with the AP 710, and the home gadget 721, the home appliance 722, and the entertainment device 723 may wirelessly communicate with each other.

While the inventive concept has been particularly shown and described with reference to embodiments thereof, it will be understood that various changes in form and details may be made therein without departing from the spirit and scope of the following claims.

What is claimed is:

1. A random number generator comprising:
a ring oscillator comprising an inverter chain comprising at least one inverter and generating an output signal;
a first phase inverter receiving an input signal of the inverter chain; and
a buffer receiving the input signal,
wherein the random number generator provides an output of the first phase inverter to the inverter chain during a first operation mode to measure a frequency of the ring oscillator and provides an output of the buffer to the inverter chain during a second operation mode for generating a random number.

2. The random number generator of claim 1, further comprising a first multiplexer, and the first multiplexer outputs a signal of the first phase inverter during the first operation mode and outputs a signal of the buffer during the second operation mode.

3. The random number generator of claim 1, wherein the at least one inverter is a skewed inverter configured differently in size ratio of p-channel metal oxide semiconductor (PMOS) and n-channel metal oxide semiconductor (NMOS).

4. The random number generator of claim 1, further comprising a counter that generates a collapse count by counting a number of pulses while the output signal of the ring oscillator stops after oscillating for a certain period due to a mismatch between the at least one inverter.

5. The random number generator of claim 4, wherein the ring oscillator further comprises a second multiplexer for adjusting a range of the collapse count, and the second multiplexer selects an inverter constituting the inverter chain among a plurality of inverters different in rising delay time and falling delay time.

6. The random number generator of claim 4, further comprises a calibration circuit that calibrates the collapse count when the collapse count is outside a preset range.

7. The random number generator of claim 4, further comprising a comparator comparing the collapse count with a preset collapse count range upper limit value and a preset collapse count range lower limit value to calibrate the collapse count.

8. The random number generator of claim 4, further comprises a calibration circuit that calibrates a range of the collapse count based on a first collapse count range corresponding to an initial operation of the ring oscillator and a second collapse count range corresponding to a random number generation operation of the ring oscillator.

9. The random number generator of claim 8, wherein a lower limit value of the second collapse count range is less than a lower limit value of the first collapse count range, and an upper limit value of the second collapse count range is greater than an upper limit value of the first collapse count range.

10. The random number generator of claim 1, further comprises a calibration circuit, wherein the output signal of the ring oscillator maintains oscillation in the first operation mode, and the calibration circuit adjusts a frequency of the output signal by comparing the output signal with a reference clock signal.

11. The random number generator of claim 1, wherein the ring oscillator further comprises a third multiplexer for adjusting a frequency of the output signal, and the third multiplexer is configured to select a number of inverters constituting the inverter chain by receiving outputs of inverters constituting the inverter chain.

12. A ring oscillator comprising:
an inverter chain including a plurality of inverters;
a first phase inverter receiving an input signal of the inverter chain; and
a buffer receiving the input signal,
wherein the ring oscillator provides an output of the first phase inverter to the inverter chain during a first operation mode to measure a frequency of the ring oscillator and provides an output of the buffer to the inverter chain during a second operation mode to generate a random number.

13. The ring oscillator of claim 12, further comprising a multiplexer selecting one of a plurality of inverters different in rising delay time and falling delay time to adjust a range of a collapse count used to generate the random number.

14. The ring oscillator of claim 12, further comprising a calibration circuit, wherein an output signal of the ring oscillator maintains oscillation in the first operation mode, and the calibration circuit adjusts a frequency of the output signal by comparing the output signal with a reference clock signal.

* * * * *